US008143976B2

(12) United States Patent
Wyland (10) Patent No.: US 8,143,976 B2
(45) Date of Patent: Mar. 27, 2012

(54) HIGH IMPEDANCE ELECTRICAL CONNECTION VIA

(75) Inventor: Christopher P. Wyland, Livermore, CA (US)

(73) Assignee: Xilinx, Inc., San Jose, CA (US)

( * ) Notice: Subject to any disclaimer, the term of this patent is extended or adjusted under 35 U.S.C. 154(b) by 347 days.

(21) Appl. No.: 12/607,027

(22) Filed: Oct. 27, 2009

(65) Prior Publication Data
US 2011/0095851 A1    Apr. 28, 2011

(51) Int. Cl.
*H01P 7/08* (2006.01)
*H03H 7/38* (2006.01)
(52) U.S. Cl. .......................................... 333/260; 333/33
(58) Field of Classification Search .............. 333/33, 333/260, 219, 204, 238, 246; 174/250
See application file for complete search history.

(56) References Cited

U.S. PATENT DOCUMENTS

| 6,710,258 | B2 | 3/2004 | Oggioni et al. |
| 6,713,685 | B1 | 3/2004 | Cotton |
| 7,619,495 | B2 * | 11/2009 | Albacete et al. ............ 333/204 |
| 7,847,654 | B2 * | 12/2010 | Lascari ........................ 333/33 |
| 2007/0222021 | A1 | 9/2007 | Yao |
| 2008/0073796 | A1 | 3/2008 | Harvey et al. |

OTHER PUBLICATIONS

Aydin, K. et al., "Investigation of magnetic resonances for different split-ring resonator parameters and designs", New Journal of Physics 7, Aug. 8, 2005, 168, 15 pages.
Wu, B. et al., "Study on Transmission Characteristic of Split-ring Resonator Defected Ground Structure", PIERS online, vol. 2, No. 6, 2006, pp. 710-714.
Zhou, J. et al., "Magnetic and electric excitations in split ring resonators", Dec. 24, 2007, vol. 15, No. 26, Optics Express, 10 pages.

* cited by examiner

*Primary Examiner* — Stephen Jones
(74) *Attorney, Agent, or Firm* — LeRoy D. Maunu (57) ABSTRACT

Vias for differential signals are typically of a lower impedance than the signal lines connected to them. The noise and reflected signals resulting in impedance mismatch may require circuits to be operated at a frequency far lower than desired. One or more embodiments of the present invention avoid impedance mismatch in circuits and achieve an advance in the art by providing a via with higher impedance through the addition of split ring resonators (SSRs) to each end of the via.

20 Claims, 9 Drawing Sheets

HIGH IMPEDANCE ELECTRICAL CONNECTION VIA

FIELD OF THE INVENTION

One or more embodiments of the present invention generally relate to vias for providing a signal path between conductors separated by a non-conductive layer, and in particular to a via with increased impedance.

BACKGROUND

Circuits contained in integrated circuit devices (ICs) or printed circuit boards (PCBs) are often composed of multiple layers of signal lines separated by insulating non-conductive layers. Signals are transmitted between the signal lines of different layers with vias. Vias are holes between non-conductive layers that have been made conductive by electroplating, use of annular rings, or small rivets.

The signal lines in the circuit are typically of a width and spaced with respect to nearby ground and power lines or planes such that they have a standard characteristic impedance, such as 50 ohms. This is done to reduce signal fluctuation and distortion caused by impedance mismatches. Matching of impedance is important because a mismatch will result in a signal being reflected at the point of the mismatch. The reflected signal results in noise and distorts the signal propagated forward. The drawbacks of impedance mismatch are particularly acute in high speed circuitry where the clock cycle may dictate that the signal propagated in a circuit remains at a stable value for a short period of time relative to the gradual rise and fall generated as a transistor switches on or off. Noise and distortion generated by impedance mismatches may be recognized as a switching transition.

Because vias for differential signals are typically of a lower impedance than the signal lines connected to them, the impedance mismatch may require circuits to be operated at a frequency far lower than desired. One or more embodiments of the present invention may address one or more of the above issues.

SUMMARY

In one embodiment of the present invention, an electrical connection via is provided. The via includes a conductor that connects electrical signals through a non-conductive layer and two or more sets of split ring resonators including at least a first set and a second set. The first and second sets each include two or more split ring resonators including at least a first and second split ring resonator. The first and second sets of resonators are located in respective first and second planes which are substantially parallel to the non-conductive layer. The placement of the conductor and the split ring resonator sets are such that the conductor is substantially surrounded by projections of the resonators through the non-conductive layer.

In another embodiment of the present invention, a semiconductor structure is provided. The structure includes an electrically conductive via, a first signal line, located in a first metal layer, connected to a first end of the via, and a second signal line, located in a second metal layer, connected to a second end of the via. A first set and a second set of split ring resonators, including at least two concentric split ring resonators, are located in respective planes substantially parallel to the first and second metal layers. The first and second sets of ring resonators are located such that the perimeter of the ends of the via are substantially surrounded by projections of the inner most ring of the first and second sets on the respective first and second metal layers.

In yet another embodiment, a circuit substrate is provided. The circuit substrate includes two or more layers which contain at least one electrically conductive signal line, including a first layer and a second layer, in which the first and second layers are separated by a nonconductive material. The circuit substrate also includes at least one electrically conductive via extending through the non-conductive material and coupling the signal line of the first and second layers. A plurality of sets of resonators, including at least a first set and a second set, are also included. Each set includes a plurality of concentric split ring resonators, including at least a first and second split ring resonator. The first set of resonators are located in a first plane substantially parallel to the first layer. Likewise the second set of resonators is located in a second plane substantially parallel to the second layer. The via and the first and second sets are located such that the via is substantially centered within the projection of each set of resonators on the first and second layers.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which:

FIG. 3-1 shows a split ring resonator configuration with two splits per ring;

FIG. 3-2 shows a split ring resonator configuration with four splits per ring;

FIG. 6-1 shows a set of octagonal split ring resonators.

FIG. 6-2 shows a set of square split ring resonators;

FIG. 7-1 shows a side view of a via configured with two sets of split ring resonators;

FIG. 7-2 shows a side view of a via configured with four sets of split ring resonators;

FIG. 7-3 shows a side view of a via configured with six sets of split ring resonators;

FIG. 7-4 shows a side view of a via configured with four sets of split ring resonators, wherein all resonator sets are placed between the signal lines;

FIG. 8-1 shows a via configured with two sets of split ring resonators and two conductive plates with a reference voltage FIG. 8-2 shows the top view of a via configured with sets of split ring resonators and conductive plates with a reference voltage.

DETAILED DESCRIPTION OF THE DRAWINGS

One or more embodiments of the present invention avoid impedance mismatch in circuits. The higher impedance is achieved by the addition of split ring resonators (SSRs) to each end of the via.

A split ring resonator consists of a conductive ring which is broken in one (or several) location(s) by a non-conductive gap of air or other dielectric material. When the ring is placed in an electro-magnetic field, the electro-magnetic fluctuation causes a circular electric current to be induced in the metallic ring, which in turn leads to a charge accumulating across the gaps. The electric field which builds due to the charge at the gap counteracts the circular current leading to energy being stored (predominantly) in the vicinity of the gaps and magnetic field energy concentrated in the region enclosed by the ring. A split ring resonator is thus a resonator which reacts to a perpendicular magnetic field and can be characterized by the effective capacitance of the gaps and effective inductance of the loop defined by the ring. It can be understood in terms of a resonant LC circuit with a resonance frequency $\omega^2_m = 1/LC$, where L is the inductance of the rings and C is the capacitance of the split ring resonator. As a signal passes through signal lines connected to the via, the current generates an electro-magnetic field which passes though the split ring resonators. The rise and fall of the signal edges create changes in the electro-magnetic field which induces currents in the rings and causes the split ring resonators to resonate. The resonation of the rings modifies the magnetic field and thereby modifies the inductive impedance of the via and signal line connections. The resonant response of a split ring resonator and its effect on the electro-magnetic field depends on the configuration and placement of the split ring resonators.

Figure 1:
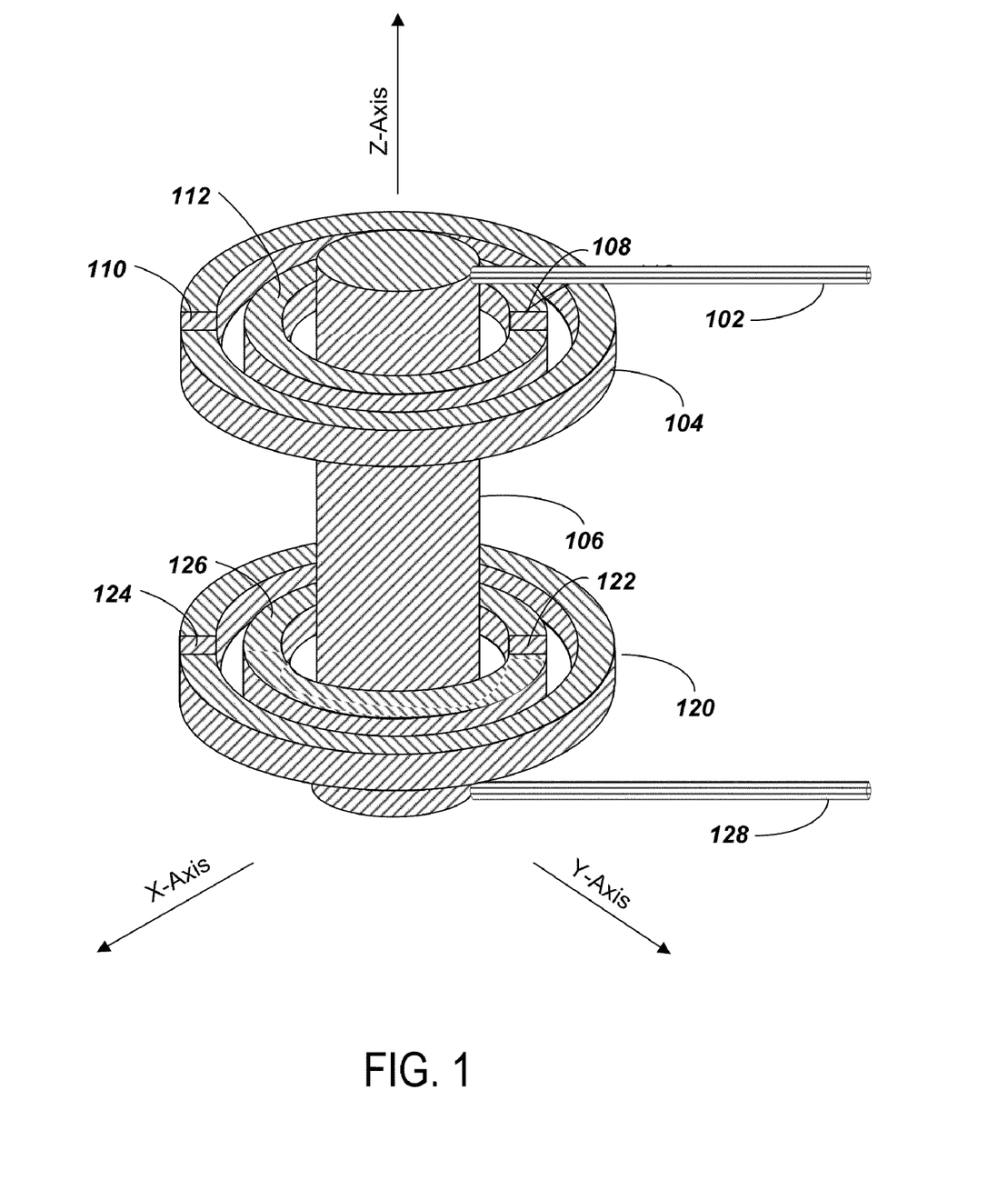
FIG. 1 shows a perspective view of a via configured with split ring resonators in accordance with an embodiment of the invention.

FIG. 1 shows a perspective view of a via configured with split rings resonators in accordance with an embodiment of the invention. Via 106 is coupled to signal lines 102 and 128 at the top and bottom of the via respectfully. Above signal line 128 and below signal line 102 are two respective sets of split ring resonators, which substantially surround via 106. The split ring resonator sets substantially surround the via in that the two rings encircle the via. Each set shown includes two split ring resonators: an outer split ring resonator 104 and 120 and an inner split ring resonator 112 and 126. The inner and outer split ring resonators are split at locations 108, 110, 122, and 124. The ring sets are located along the z axis such that they are conductively isolated from signal lines 102.

For ease of exposition, the terms above, below, top, and bottom are used to describe the positional relationships between the described elements. Those skilled in the art will recognize that these terms are not intended to be limiting since flipping the structure top-to-bottom would not change the characteristics of the structure.

In practice, signal lines 128 and 102 are separated by a non-conductive layer (not shown). The signal lines lie in two parallel planes which bound the non-conductive layer. In the via configuration shown, the two sets of split ring resonators are located within the non-conductive layer between the two signal line planes. The split ring resonator sets can alternately be said to be located between the signal line planes. These phrases are used interchangeably herein.

The sets of split ring resonators are located close to the ends of the via but separated from the signal line planes at a distance sufficient to conductively isolate the split ring resonator sets from the signal lines. Via 106, may be a solid or, alternatively, may be a hollow cylinder with walls having conductive material. By adjusting the resonance frequency of the split ring resonators, the resistance to fluxuations in the magnetic field created by current flowing through the signal lines and via is adjusted and the impedance of the via can be increased.

Figure 2:
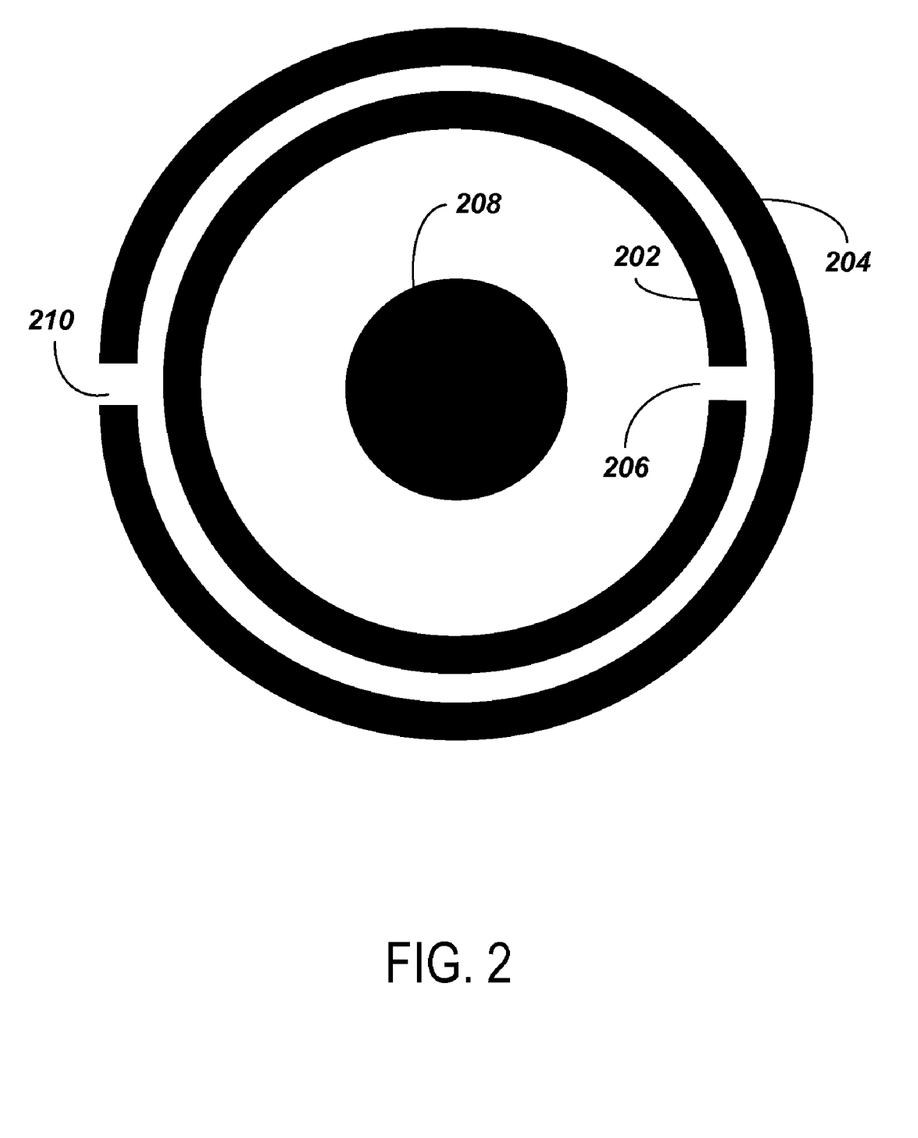
FIG. 2 shows a top view of a via configured with split ring resonators in accordance with an embodiment of the invention.

FIG. 2 shows a top view of the configured via of FIG. 1. Via 208 is centered within the set of split ring resonators 202 and 204. The split ring resonators are oriented such that the splits 206 and 210 of the inner ring and outer ring, respectively, are opposite of each other. The resonant response of a split ring resonator is dependent on the capacitance of the split ring resonator. The capacitance of the split ring resonator comes from the splits and the gap between adjacent rings. The gap essentially forms a parallel plate capacitor. In a parallel plate capacitor, capacitance is directly proportional to the surface area of the conductor plates and inversely proportional to the separation distance between the plates. The capacitance is given by the equation: $C = \in A/S$, where C is the capacitance of the gap, $\in$ is the permittivity of the separator, A is the area of the parallel plates and S is the separation distance or gap size. Increasing the gap size results in a decrease in capacitance and thus increases the resonation frequency of the split ring resonator.

Figure 31:
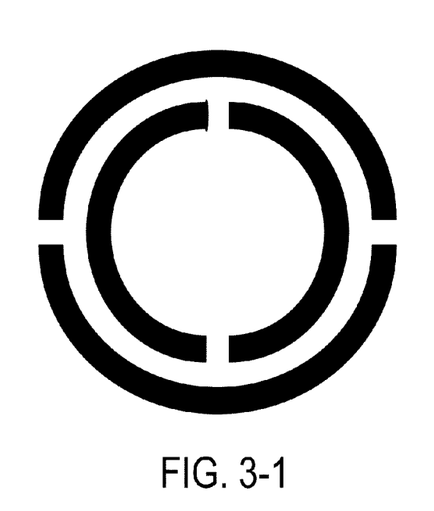
Figure 32:
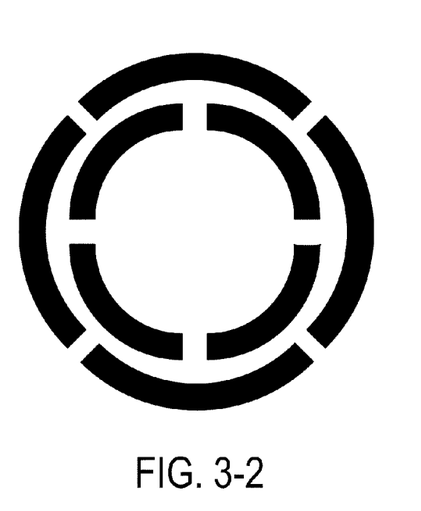

Similarly, a split ring resonator may include a various number of ring splits. FIG. 3-1 shows a split ring resonator configuration with two splits per ring. In this configuration, the inner and outer splits are separated by a 90 degree rotation of one of the rings. FIG. 3-2 shows a split ring resonator configuration with four splits per ring. In this configuration, the inner and outer splits are separated by a 45 degree rotation of one of the rings. Increasing the number of ring splits results in an increase in the number of capacitors in each ring. However, as the rings are connected in series the capacitance is decreased. As additional splits are added, capacitance of each ring becomes: $1/(C1+C2+C3 \ldots Cn)$, where capacitance of each individual split is represented in the denominator of the equation. Therefore, in doubling number of splits in the split ring resonator in FIG. 3-2 the resulting capacitance is half that of the split ring resonator in FIG. 3-1. As a result the resonant frequency of the split ring resonator set is increased.

Conversely, capacitance may be increased by increasing the number of split ring resonator rings. Additional rings result in increased mutual capacitance between rings which in turn, result in a decrease in the resonate frequency of the split ring resonator in each set.

Figure 4:
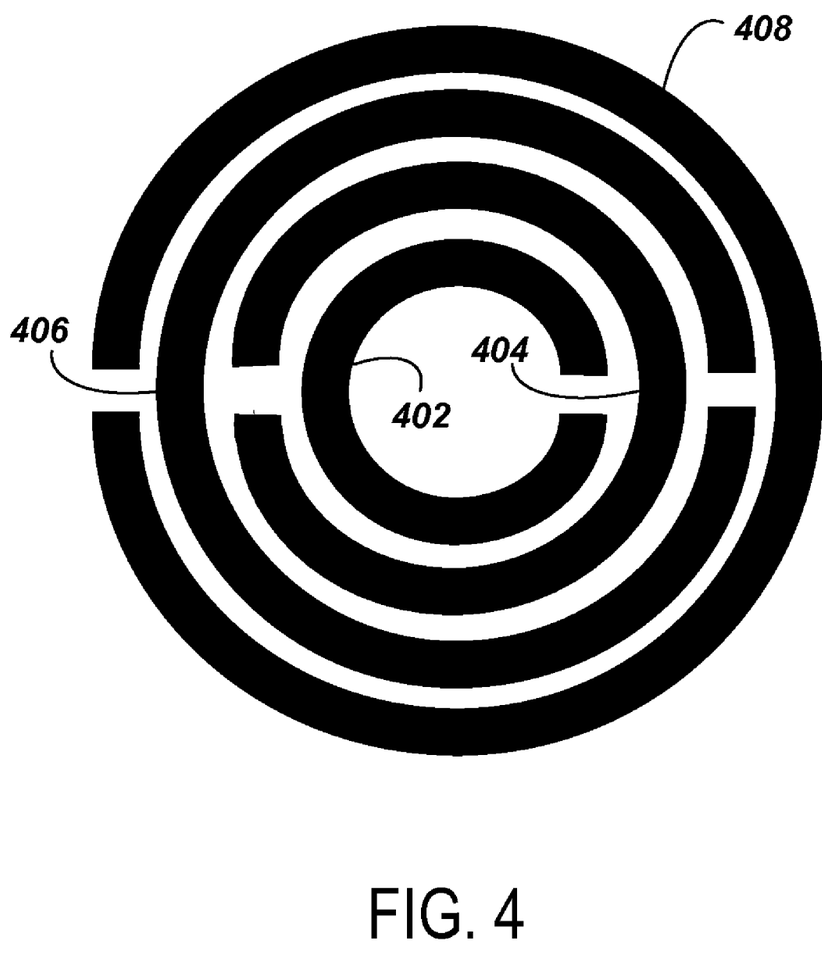
FIG. 4 shows a set of split ring resonators with four split ring resonators.

FIG. 4 shows a set of split ring resonators with four split ring resonators 402, 404, 406, and 408. The orientation of adjacent resonator rings varies the mutual capacitance of the resonator rings. In the configuration shown in FIG. 4, adjacent rings are oriented such that the ring splits of the inner ring and outer ring are opposite of each other. However, such orientation is not required, and one or more other embodiments can include different orientations. It is understood that the orientation of the inner and outer splits may be adjusted for various applications. Resonator rings may be symmetrically oriented such that splits of adjacent rings are aligned. When adjacent rings are aligned so that splits are symmetrically oriented, the mutual capacitance becomes very small. When symmetrically orientated, an increase in the number of rings will have little effect on capacitance of the system. As rings are oriented to move the gaps farther away from each other, mutual capacitance is increased. It is understood that a set of split ring resonators used to implement one or more embodiments of the present invention may include any number of rings.

Figure 5:
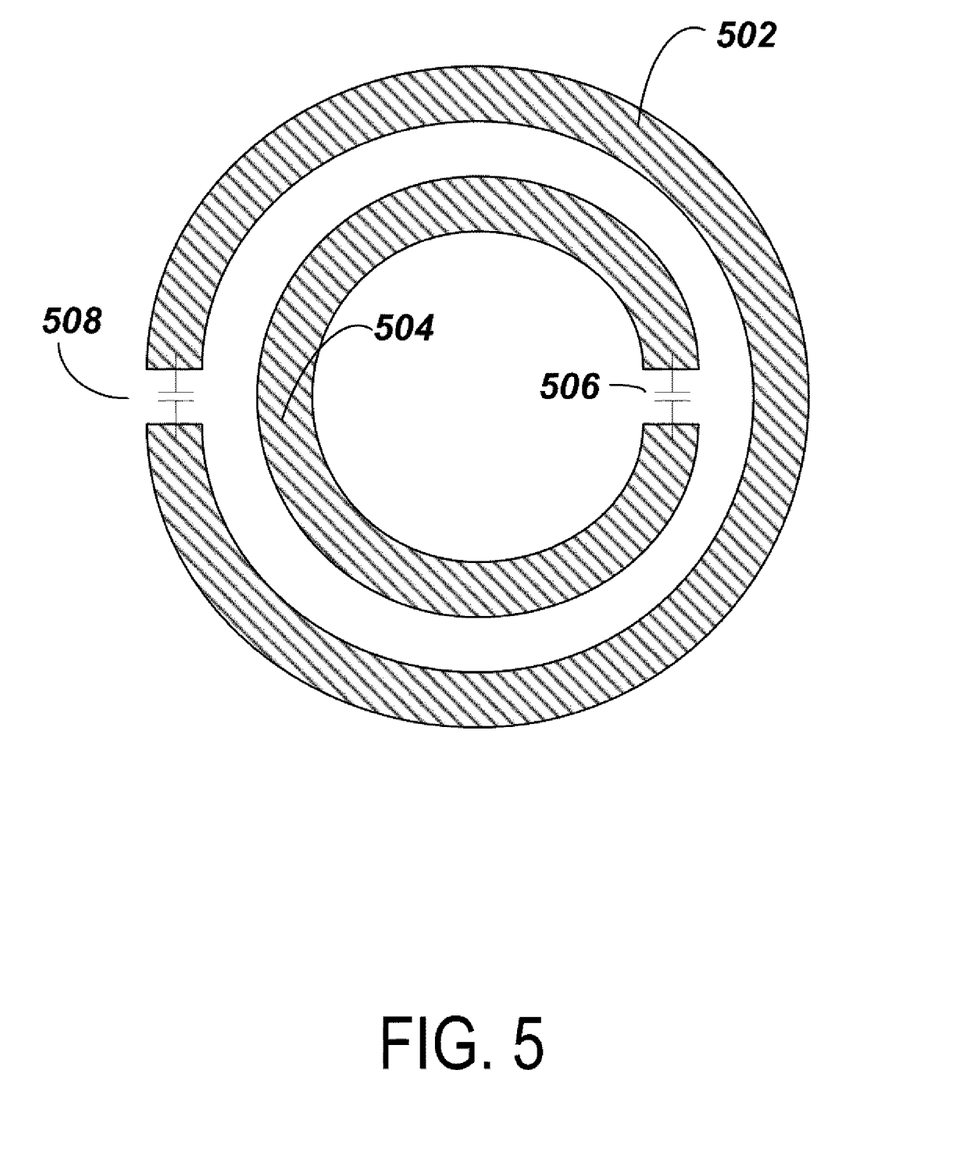
FIG. 5 shows a set of split ring resonators configured with increased capacitance.

Additionally, if more capacitance is needed, a capacitor can be coupled to each side of a gap to set the capacitance. FIG. 5 shows a set of split ring resonators with increased capacitance. The set includes inner split ring 504 and outer split ring 502. Capacitors 506 and 508 are connected across the ring split gaps of the respective inner and outer rings.

The widths of the rings can also be varied to adjust capacitance. The effect of changing ring width is dominated by the mutual capacitance between adjacent rings. Increasing the depth of the rings, increases the surface area between adjacent rings. Therefore, increasing the depth of the rings will result in increased capacitance. In practice, the size, width, diameter, and number of split rings is limited only by package design rules for size, length, and clearance of signal lines and components. For example, the diameter of an inner ring of a split ring resonator may be limited such that a certain distance from the conductive signal path provided by the via is maintained.

Figure 61:
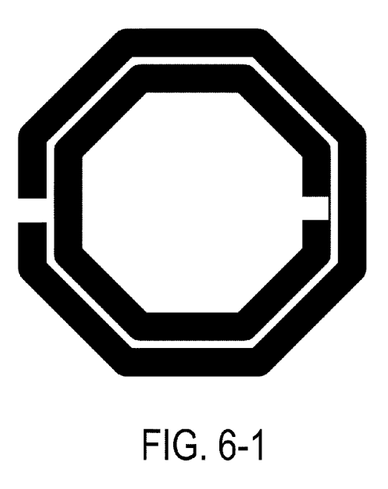
Figure 62:
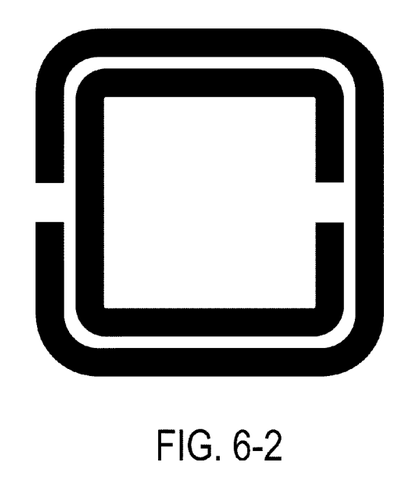

The split ring resonators that may be used in the various embodiments of the invention are not limited to circular rings. Split ring resonators may be manufactured in wide a variety of different shapes. FIGS. 6-1 and 6-2 each show a non-circular set of split ring resonators that may be used in accordance with various embodiments of the invention. FIG. 6-1 shows a set of octagonal split rings resonators. FIG. 6-2 shows a set of square split rings resonators. The square split ring resonators shown in FIG. 6-2 are typically used in split ring resonator applications because they are easy to manufacture at a small scale. Those skilled in the art will recognize that any of a variety of other polygons may be constructed consistent with design constraints and objectives.

FIGS. 7-1, 7-2, 7-3, and 7-4 show side views of a via with various configurations of split ring resonators. These figures illustrate that a set of split ring resonators may be placed above or below each signal line. Also, a various number of split ring resonator sets may be used in a given configuration. One example configuration utilizes an even number of split ring resonator sets such that the same number of sets is associated which each of the signal lines. The placement of the split ring resonator sets associated with the first signal line mirror the placement of the sets associated with the second signal line. Placement is mirrored in that for a split ring resonator set located at a distance D from the first signal line, there is a split ring resonator set located at a distance D from the second signal line FIG. 7-1 shows a via configured with two sets of split ring resonators. Via 704 is coupled to signal lines 706 and 708. Split ring resonator sets 710 and 712 are placed above signal line 706 and below signal line 708 respectively. In practice, signal lines 706 and 708 are separated by a non-conductive layer 705. The signal lines lie in two parallel planes which bound the non-conductive layer 705. Split ring resonator sets 710 and 712 are placed in planes parallel to the signal line planes. Split ring resonator sets are also placed such that via 704 is substantially centered in projections of the ring resonator sets 714 through the signal line planes. The sets of split ring resonators are located close to the end of the via but separated from the signal line planes at a distance sufficient to conductively isolate the split ring resonator sets from the signal lines.

Figure 71:
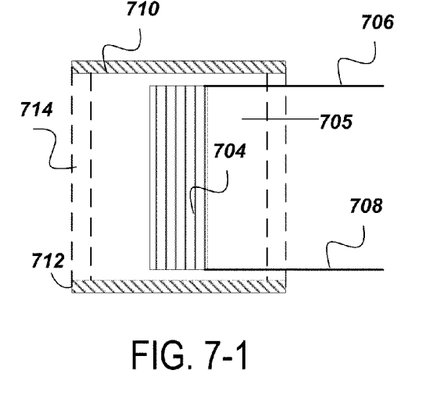
Figure 72:
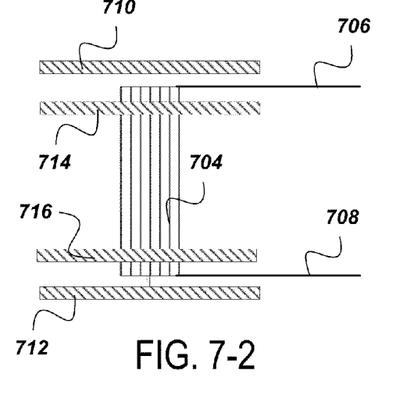

FIG. 7-2 shows a via configured with four sets of split ring resonators. As in FIG. 7-1, via 704 is coupled to signal lines 706 and 708. Split ring resonator sets 710 and 712 are placed above signal line 706 and below signal line 708 respectively. Two additional split ring resonator sets 714 and 716 are placed in between the signal lines, below signal line 706 and above signal line 708 respectively. As with the configuration of FIG. 7-1, via 704 is centered within projections of the split ring resonator sets. Split ring resonator sets are paired and placed in a mirrored arrangement such that 710 and 712 sets are equal distance from respective signal lines 706 and 708. However, those skilled in the art will recognize that an unbalanced configuration may be desirable for certain applications such as providing a gradual transition from a high impedance signal line to a low impedance signal line. In an embodiment having an odd number of split ring resonator sets, distance from signal lines, as well as the number and size of rings may be adjusted as discussed above to set the impedance of each end of the via.

Figure 73:
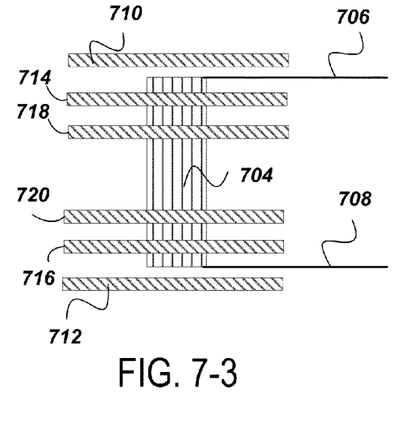

FIG. 7-3 shows a via configured with six sets of split ring resonators. As in FIG. 7-2, via 704 is coupled to signal lines 706 and 708. Split ring resonator sets 710 and 712 are placed above signal line 706 and below signal line 708 respectively. Split ring resonator sets 714 and 716 are placed in the non-conductive layer (not shown) between signal lines, below signal line 706 and above signal line 708 respectively. Additionally, two sets of split ring resonators 718 and 720 are placed between resonator sets 714 and 716. It is preferred that split ring resonator sets 718 and 720 are placed near respective sets 714 and 716 such that there is mutual capacitance between respective sets.

The arrangement of the number of split ring resonator sets above a signal line need not be the same as the number below such as shown in FIG. 7-3. In this configuration, four sets of split ring resonators 714, 716, 718 and 720 are placed in a non-conducting layer between planes containing the signal lines, and two sets of split ring resonators 710 and 712 are placed outside of the set of planes between the signal line planes. In an alternative configuration, a greater number of split ring resonator sets is placed outside the subset of planes occupied by the non-conductive layer between signal line planes. The alternative configuration may produce results similar to the arrangement in FIG. 7-3

Figure 74:
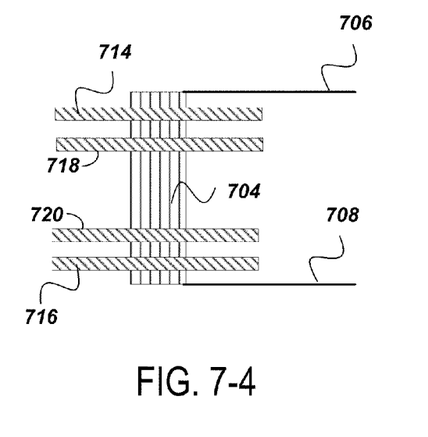

FIG. 7-4 shows a via configured with four sets of split ring resonators wherein all resonator sets are placed between the signal lines. Via 704 is coupled to signal lines 706 and 708. Split ring resonator sets 714 and 716 are placed in between the signal lines, below signal line 706 and above signal line 708 respectively. Split ring resonators sets 718 and 720 are placed between resonator sets 714 and 716. In an alternative configuration, sets of split ring resonators are placed outside the signal lines with no sets between the signal lines. This alternate configuration will produce results similar to the arrangement in FIG. 7-4

Figure 81:
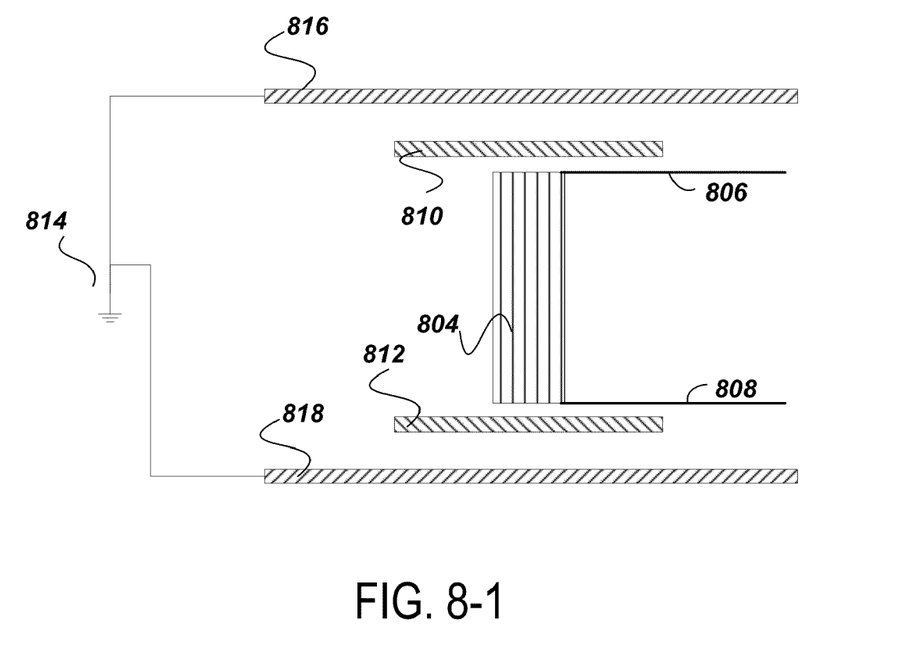

FIG. 8-1 shows a via configured with two sets of split ring resonators and two conductive plates. Via 804 is coupled to signal lines 806 and 808. Split ring resonator sets 810 and 812 are placed above signal line 806 and below signal line 808, respectively. Conductive plates 816 and 818 are placed near the resonator sets, above set 810 and below set 812 respectively. Each plate is tied to a ground reference voltage 814.

Figure 82:
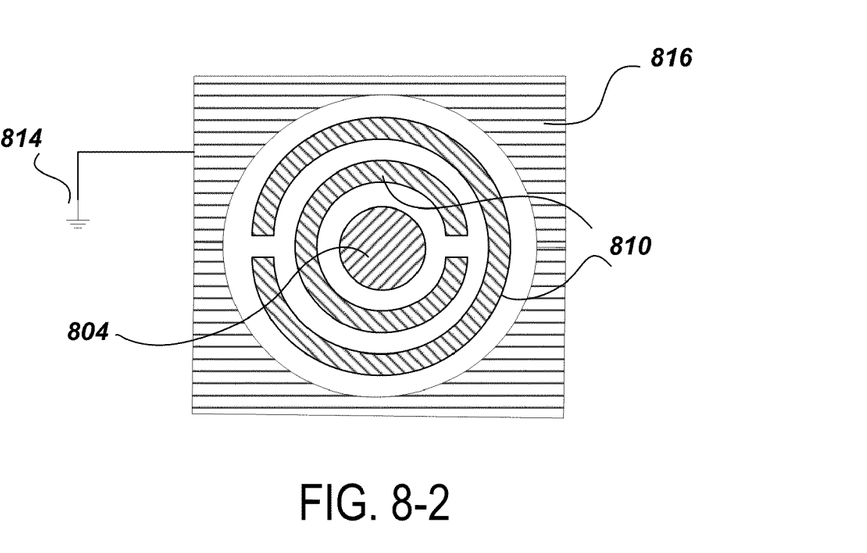

FIG. 8-2 shows via configuration an alternate arrangement of reference plates. In FIG. 8-2, a top view of via 804 and ring sets 810 is shown. Conductive plates 816 are shown with a cutout that is larger than the diameter of the split ring resonator sets. When reference plates are cutout as shown in FIG. 8-2. The reference plates can be placed in any plane such that they are conductively isolated from the split ring resonators, the via, and the signal lines. The impedance of a nearby set of split ring resonators is dependant on the distance between the ground reference provided by the plates and the split ring resonator sets.

Figure 9:
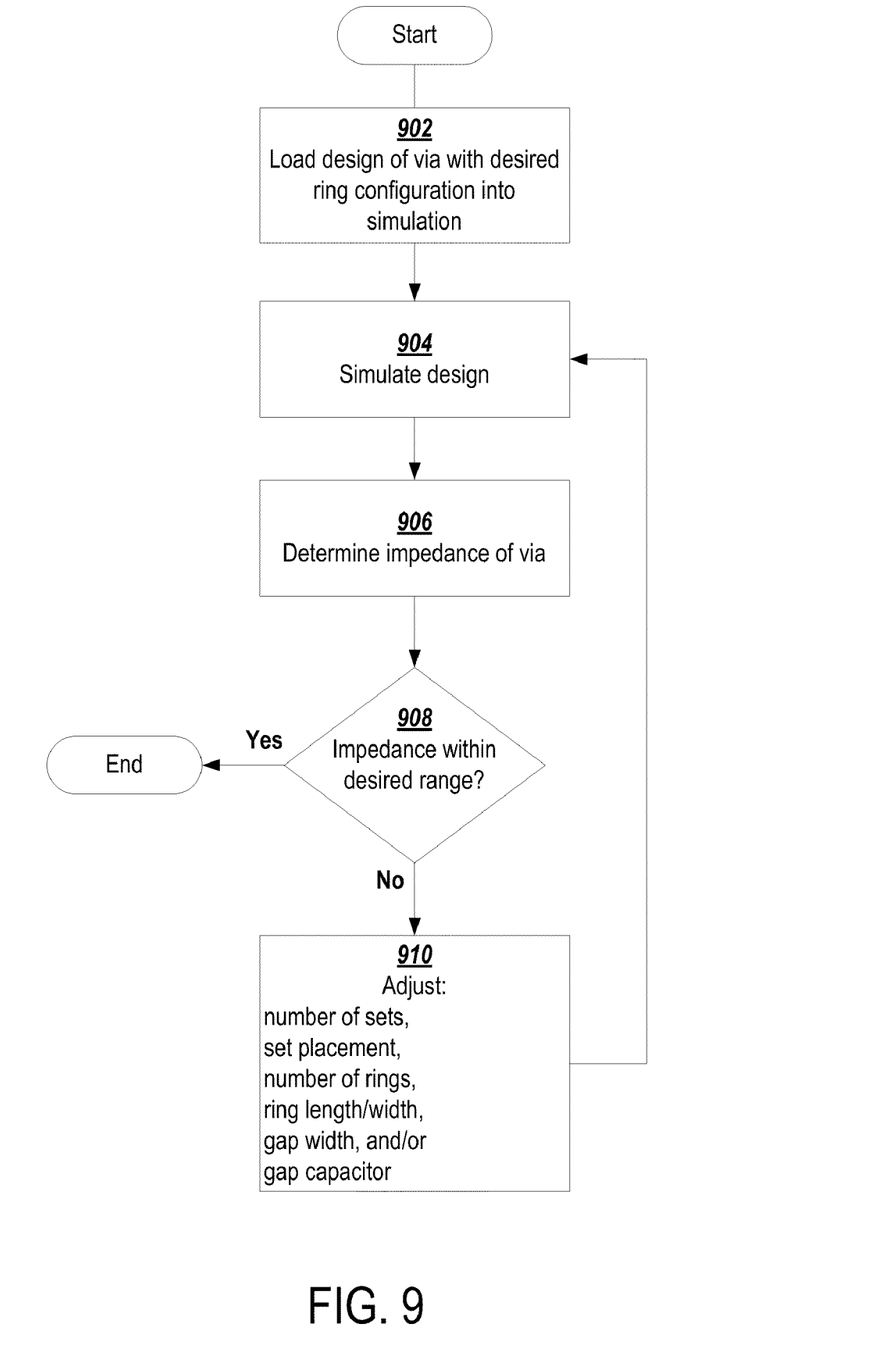
FIG. 9 illustrates a flowchart of a process for determining split ring resonator design parameters through simulation in accordance with an embodiment of the invention.

FIG. 9 illustrates a flowchart of a process for determining split ring resonator design parameters through simulation. A via design with a desired ring configuration is loaded into a simulation environment at step 902. The design is simulated at step 904. Based on simulation results, the value of the via impedance is determined at step 906. If impedance is within a desired range at decision step 908, the process is done and the via can be implemented as configured.

Otherwise, design parameters are adjusted at step 910. Adjustable design parameters include but are not limited to: the number of sets; set placement; number of rings within each set; ring length/width; gap width; and gap capacitor value. After design parameters have been adjusted, the design is simulated again at step 904, and the impedance is determined at 906. The adjustment and simulation steps are repeated until the determined impedance is within a desired range at decision step 908.

Those skilled in the art will appreciate that various alternative computing arrangements, including one or more processors and a memory arrangement configured with program code, would be suitable for performing the simulation processes to determine split ring resonator design parameters.

One or more embodiments of the present invention are thought to be applicable to a variety of via configurations and uses. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. An electrical connection via, comprising:
   a conductor that connects electrical signals through a non-conductive layer;
   a plurality of sets of split ring resonators including at least a first set and a second set of resonators, wherein each set comprises a plurality of split ring resonators including at least a first and second split ring resonator;
   wherein the first set of resonators is located in a first layer substantially parallel to the non-conductive layer;
   wherein the second set of resonators is located in a second layer substantially parallel to the non-conductive layer; and
   wherein the first set of resonators is located proximate to a first end of the conductor and the second set of resonators is located proximate to a second end of the conductor, wherein the first end of the conductor is opposite to the second end of the conductor.

2. The electrical connection via of claim 1, wherein the conductor is substantially centered within each set of resonators on the non-conductive layer.

3. The electrical connection via of claim 1, wherein each set of resonators is conductively isolated from all other conductive material.

4. The electrical connection via of claim 1, wherein the outermost diameter of the first split ring resonator of each set is smaller than the innermost diameter of the second split ring resonator of each set, and the outermost diameter of the conductor is smaller than the innermost diameter of the first split ring resonator of each set.

5. The electrical connection via of claim 1, wherein the first and second layers are within the non-conductive layer.

6. The electrical connection via of claim 1, wherein the first and second layers are outside the non-conductive layer.

7. The electrical connection via of claim 1, further comprising a capacitor coupled across splits of each split ring resonator.

8. The electrical connection via of claim 1, wherein each set of split ring resonators is electromagnetically coupled to the conductor.

9. The electrical connection via of claim 1, further comprising:
   a first and a second electrically conductive plane coupled to respective reference voltages and respectively electromagnetically coupled to the first and second sets of split ring resonators.

10. A semiconductor structure comprising:
    an electrically conductive via;
    a first signal line in a first metal layer and connected to a first end of the via;
    a second signal line in a second metal layer and connected to a second end of the via;
    a first set of split ring resonators including at least two concentric split ring resonators, wherein the first set of resonators occupies at least one layer substantially parallel to the first metal layer;
    a second set of split ring resonators including at least two concentric split ring resonators, wherein the second set of resonators occupies at least one layer substantially parallel to the second metal layer;
    wherein a perimeter of the first end of the via is substantially surrounded by an inner-most resonator ring in the first set; and
    wherein a perimeter of the second end of the via is substantially surrounded by an inner-most resonator ring in the second set.

11. The semiconductor structure of claim 10, wherein the via is substantially centered within the first set of split ring resonators on the first metal layer and is substantially centered within the second set of split ring resonators on the second metal layer.

12. The semiconductor structure of claim 10, wherein each split ring resonator is conductively isolated from all other conductive material.

13. The semiconductor structure of claim 10, wherein the split ring resonators of each set are of different diameters and the innermost diameter of the split ring resonator with the smallest diameter is larger than the diameter of the via.

14. The semiconductor structure of claim 10, wherein the first and second sets of split ring resonators occupy layers that are outside an area that is bounded by the first and second metal layers.

15. The semiconductor structure of claim 10, wherein the first and second sets of split ring resonators occupy layers that are within an area that is bounded by the first and second metal layers.

16. The semiconductor structure of claim 10, further comprising a capacitor coupled across splits of each split ring resonator.

17. The semiconductor structure of claim 10, wherein the first and second sets of split ring resonators are electromagnetically coupled to the via.

18. A circuit substrate comprising:
    first and second layers containing first and second electrically conductive signal lines, respectively, wherein the first and second layers are separated by a nonconductive material;
    at least one electrically conductive via extending through the non-conductive material and coupling the first and second signal lines;
    a plurality of sets of resonators, including at least a first set and a second set of resonators, wherein each set comprises a plurality of concentric split ring resonators, including at least a first and a second split ring resonator;
    wherein the first set of resonators is located in a third layer substantially parallel to the first layer;
    wherein the second set of resonators is located in a fourth layer substantially parallel to the second layer; and
    wherein the via is substantially centered within each set of resonators.

19. The circuit substrate of claim 18, wherein the third and fourth layers are within an area occupied by the non-conductive material.

20. The circuit substrate of claim 18, wherein each split ring resonator is conductively isolated from all other conductive material.

* * * * *